(12) United States Patent
Jiang et al.

(10) Patent No.: US 10,134,754 B2
(45) Date of Patent: Nov. 20, 2018

(54) METHOD FOR FORMING A 3-D MEMORY DEVICE AND THE 3-D MEMORY DEVICE FORMED THEREBY

(71) Applicant: MACRONIX INTERNATIONAL CO., LTD., Hsinchu (TW)

(72) Inventors: Yu-Wei Jiang, Hsinchu (TW); Min-Feng Hung, New Taipei (TW); Jia-Rong Chiou, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/456,700

(22) Filed: Mar. 13, 2017

(65) Prior Publication Data

US 2018/0261622 A1 Sep. 13, 2018

(51) Int. Cl.
| H01L 27/115 | (2017.01) |
| H01L 27/11582 | (2017.01) |
| H01L 27/11568 | (2017.01) |

(52) U.S. Cl.
CPC .. *H01L 27/11582* (2013.01); *H01L 27/11568* (2013.01)

(58) Field of Classification Search
CPC ............ H01L 27/11582; H01L 27/11568
See application file for complete search history.

(56) References Cited

U.S. PATENT DOCUMENTS

| 9,379,126 B2 | 6/2016 | Chiu et al. |
| 2002/0009876 A1* | 1/2002 | Wege ............... H01L 21/76801 438/637 |
| 2003/0214022 A1 | 11/2003 | Yang et al. |
| 2006/0289914 A1 | 12/2006 | Jeungling |

(Continued)

FOREIGN PATENT DOCUMENTS

| CN | 104051347 A | 9/2014 |
| CN | 106158777 A | 11/2016 |

(Continued)

OTHER PUBLICATIONS

TIPO Office Action dated Jul. 13, 2017 in Taiwan application (No. 106107896).

(Continued)

*Primary Examiner* — Kyoung Lee
*Assistant Examiner* — Christina Sylvia
(74) *Attorney, Agent, or Firm* — McClure, Qualey & Rodack, LLP

(57) ABSTRACT

A method for forming a semiconductor structure includes the following steps. First, a preliminary structure is provided. The preliminary structure has an array region. The preliminary structure includes a plurality of first stacks in the array region. Then, a first dielectric layer is formed on the first stacks. A first hard mask layer is formed on the first dielectric layer. An insulating material is formed on the first hard mask layer. Then, a planarization process stopped on the first hard mask layer is conducted. Thereafter, the first hard mask layer is removed. A second hard mask layer is formed on the first dielectric layer. A second dielectric layer is formed on the second hard mask layer. A plurality of contacts are formed through the second dielectric layer, the second hard mask layer and the first dielectric layer to the preliminary structure.

18 Claims, 12 Drawing Sheets

(56) References Cited

U.S. PATENT DOCUMENTS

| | | | |
|---|---|---|---|
| 2011/0092044 A1 | 4/2011 | Huang et al. | |
| 2014/0264897 A1* | 9/2014 | Chiu | H01L 21/28282 |
| | | | 257/773 |
| 2015/0017798 A1 | 1/2015 | Zhang | |
| 2015/0108563 A1* | 4/2015 | Lai | H01L 27/11578 |
| | | | 257/324 |
| 2015/0115337 A1 | 4/2015 | Yang et al. | |
| 2015/0236039 A1* | 8/2015 | Kim | H01L 27/11582 |
| | | | 438/269 |
| 2016/0190154 A1 | 6/2016 | Nozawa | |
| 2017/0294444 A1* | 10/2017 | Jiang | H01L 27/11582 |

FOREIGN PATENT DOCUMENTS

| | | |
|---|---|---|
| TW | 201436098 A | 9/2014 |
| TW | 201639150 A | 11/2016 |

OTHER PUBLICATIONS

TIPO Office Action dated Mar. 12, 2018 in Taiwan application (No. 106107896).

\* cited by examiner

METHOD FOR FORMING A 3-D MEMORY DEVICE AND THE 3-D MEMORY DEVICE FORMED THEREBY

TECHNICAL FIELD

This disclosure relates to a method for forming a semiconductor structure and the semiconductor structure formed thereby. More particularly, this disclosure relates to a method for forming a semiconductor structure using two hard mask layers and the semiconductor structure formed thereby.

BACKGROUND

For reasons of decreasing volume and weight, increasing power density, improving portability and the like, three-dimensional (3-D) semiconductor structures have been developed. However, further improvements for such 3-D semiconductor structures and the methods for forming such 3-D semiconductor structures may still be needed. For example, in a 3-D memory device, stacks comprising alternately stacked conductive layers and insulating layers may be formed for the construction of memory cells. Irregular portions in the layers constituting the stacks caused by defects or other reasons may lead to an undesired failure of the final memory device. As such, a method that can prevent such an undesired failure will be desired.

SUMMARY

This disclosure is directed to a method for forming a semiconductor structure and the semiconductor structure formed thereby.

According to some embodiments, a method for forming a semiconductor structure comprises the following steps. First, a preliminary structure is provided. The preliminary structure has an array region. The preliminary structure comprises a plurality of first stacks in the array region. Then, a first dielectric layer is formed on the first stacks. A first hard mask layer is formed on the first dielectric layer. An insulating material is formed on the first hard mask layer. Then, a planarization process stopped on the first hard mask layer is conducted. Thereafter, the first hard mask layer is removed. A second hard mask layer is formed on the first dielectric layer. A second dielectric layer is formed on the second hard mask layer. A plurality of contacts are formed through the second dielectric layer, the second hard mask layer and the first dielectric layer to the preliminary structure.

According to some embodiments, a semiconductor structure has an array region and a periphery region. The semiconductor structure comprises a plurality of first stacks in the array region and an opening in the periphery region. The semiconductor structure further comprises a first dielectric layer disposed on the first stacks and conformally disposed in the opening. The semiconductor structure further comprises a first hard mask layer conformally disposed on the first dielectric layer in the opening. The semiconductor structure further comprises an insulating material filled into a remaining space of the opening. The insulating material has a flat top surface. The semiconductor structure further comprises a second hard mask layer disposed on the first dielectric layer on the first stacks and disposed on the flat top surface of the insulating material in the opening. The semiconductor structure further comprises a second dielectric layer disposed on the second hard mask layer. The semiconductor structure further comprises a plurality of contacts penetrating through the second dielectric layer, the second hard mask layer and the first dielectric layer.

Figure 1A:
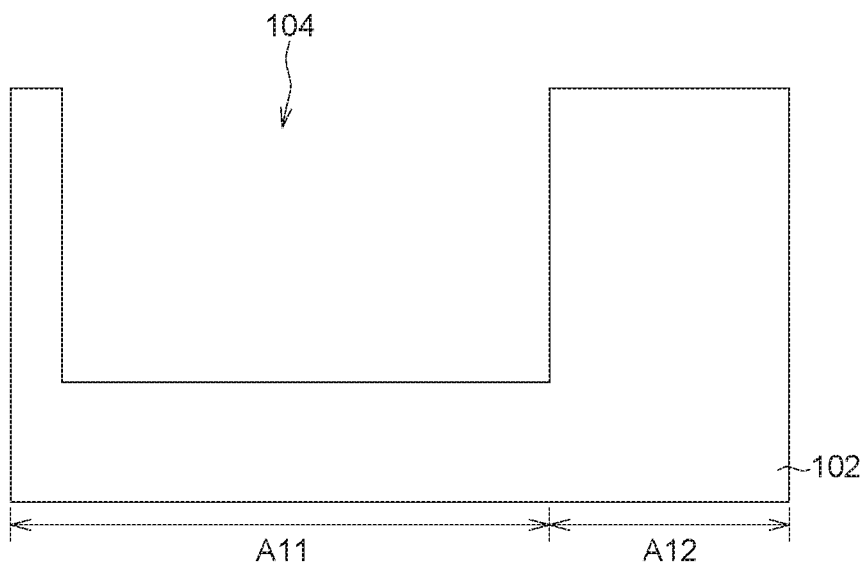
FIGS. 1A-1L illustrate a method for forming a semiconductor structure according to embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. The accompanying drawings are provided for illustrative and explaining purposes rather than a limiting purpose. For clarity, the elements may not be drawn to scale. In addition, some components and/or reference numerals may be omitted from some drawings. It is contemplated that the elements and features of one embodiment can be beneficially incorporated in another embodiment without further recitation.

A method for forming a semiconductor structure according to embodiments comprises the following steps. First, a preliminary structure is provided. The preliminary structure has an array region. The preliminary structure comprises a plurality of first stacks in the array region. Then, a first dielectric layer is formed on the first stacks. A first hard mask layer is formed on the first dielectric layer. An insulating material is formed on the first hard mask layer. Then, a planarization process stopped on the first hard mask layer is conducted. Thereafter, the first hard mask layer is removed. A second hard mask layer is formed on the first dielectric layer. A second dielectric layer is formed on the second hard mask layer. A plurality of contacts are formed through the second dielectric layer, the second hard mask layer and the first dielectric layer to the preliminary structure.

Referring to FIGS. 1A-1L, an exemplary forming method according to embodiments is shown. For ease of understanding, the method is illustrated to form a semiconductor structure that can be a 3-D single gate vertical channel (SGVC) memory structure.

As shown in FIG. 1A, a substrate 102 is provided. The substrate 102 may be formed of polysilicon or the like. The substrate 102 has an array region A11. The substrate 102 may further have a periphery region A12. The substrate 102 has a recess portion 104 in the array region A11.

Figure 1B:
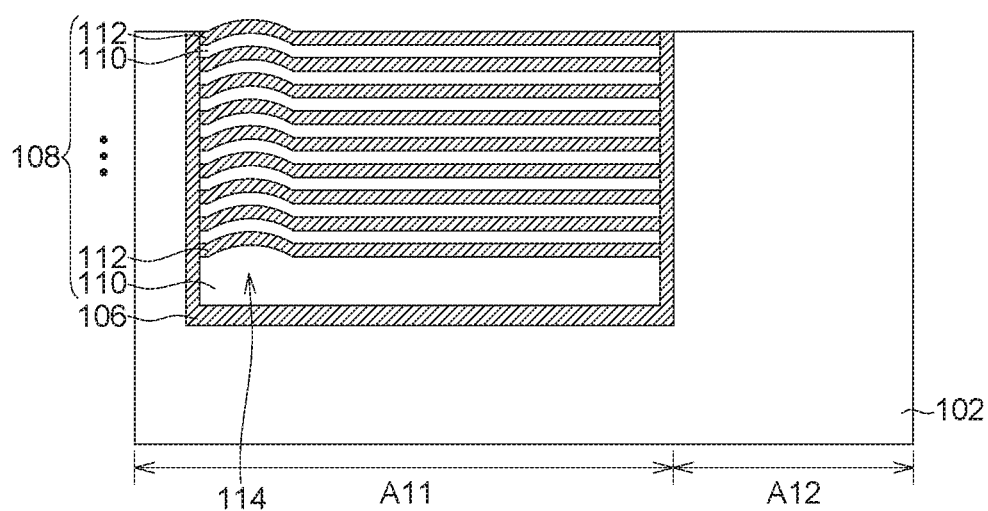

As shown in FIG. 1B, an initial stack 108 is formed in recess portion 104, such as by a CVD process, a sputter process or the like. More specifically, an isolation layer 106 may first be conformally formed in the recess portion 104. The isolation layer 106 may be formed of oxide. Then, the initial stack 108 is formed in the recess portion 104 and isolated from the substrate 102 by the isolation layer 106. The initial stack 108 comprises alternately stacked conductive layers 110 and insulating layers 112. The conductive layers 110 may be formed of polysilicon, such as doped-polysilicon. The insulating layers 112 may be formed of oxide. In some cases, the initial stack 108 comprises an irregular portion 114, such as a bump portion. The irregular portion 114 may be caused by defects such as an impurity, a lattice dislocation or the like. For example, the irregular portion 114 may be formed in a conductive layer 110 formed of polysilicon during a deposition process due to the existence of an impurity, a lattice dislocation or the like. The irregular portion 114 produces a local non-flat top surface, such as the hill portion shown in the drawings.

Figure 1C:
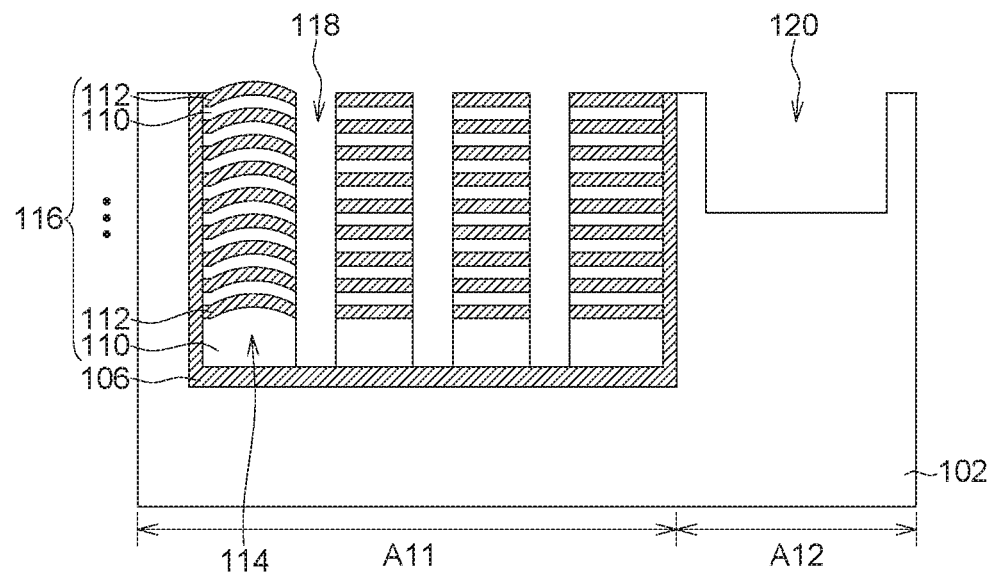

As shown in FIG. 1C, a plurality of first stacks 116 are formed by a patterning process. For example, a litho-etching process with a photo resist may be conducted. As such, the first stacks 116 are separated from each other by a plurality of trenches 118. In addition, by this patterning process, an opening 120 may be formed in the periphery region A12. More specifically, the opening 120 is directly formed in the substrate 102 in the periphery region A12. A depth of the opening 120 may be smaller than a depth of the trenches 118.

Figure 1D:
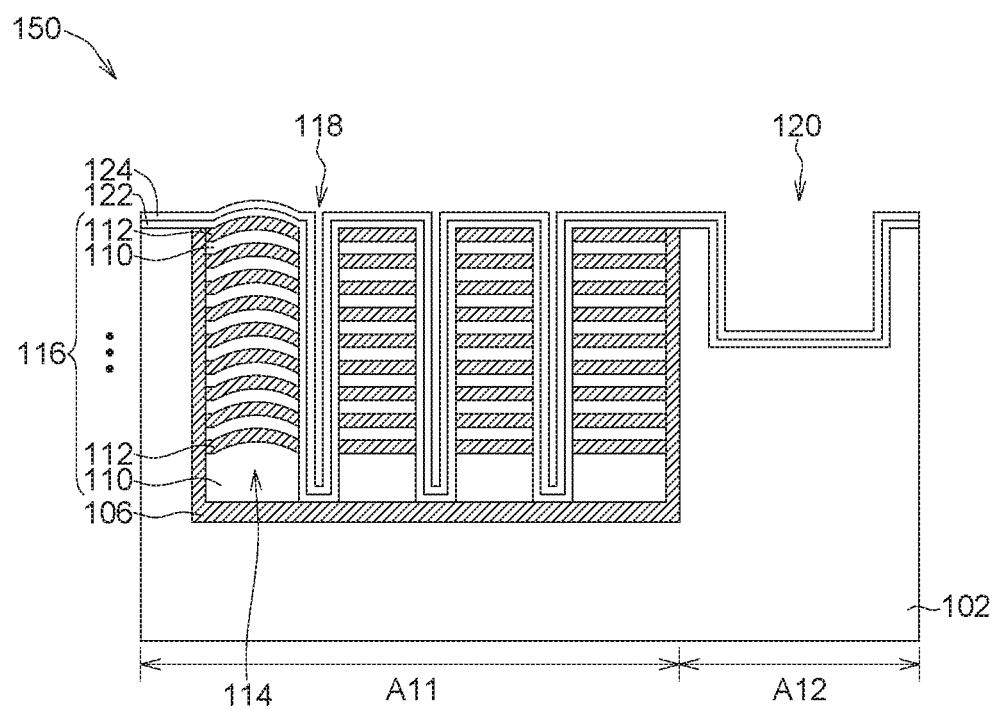

As shown in FIG. 1D, a memory layer 122 is conformally formed on the first stacks 116 and the trenches 118 separating the first stacks 116. The memory layer 122 may be further conformally formed in the opening 120. The memory layer 122 may comprise ONO (oxide-nitride-oxide) multilayers or the like. A channel layer 124 is conformally formed on the memory layer 122. The channel layer 124 may be formed of polysilicon.

As such, a preliminary structure 150 can be provided. The preliminary structure 150 has an array region A11. The preliminary structure 150 may further have a periphery region A12. The preliminary structure 150 may comprise a substrate 102 having a recess portion 104 in the array region A11. The preliminary structure 150 comprises a plurality of first stacks 116 in the array region A11. In the example shown in FIGS. 1A-1L, the first stacks 116 are formed in the recess portion 104. Each of the first stacks 116 may comprise alternately stacked conductive layers 110 and insulating layers 112. The preliminary structure 150 may comprise an isolation layer 106 conformally disposed in the recess portion 104. The first stacks 116 formed in the recess portion 104 are isolated from the substrate 102 by the isolation layer 106. The preliminary structure 150 may further comprise an opening 120 in the periphery region A12. The opening 120 may be directly formed in the substrate 102 in the periphery region A12. The preliminary structure 150 may further comprise a memory layer 122 and a channel layer 124. The memory layer 122 is conformally formed on the first stacks 116 and the trenches 118 separating the first stacks 116 and is conformally formed in the opening 120. The channel layer 124 is conformally formed on the memory layer 122.

Figure 1E:
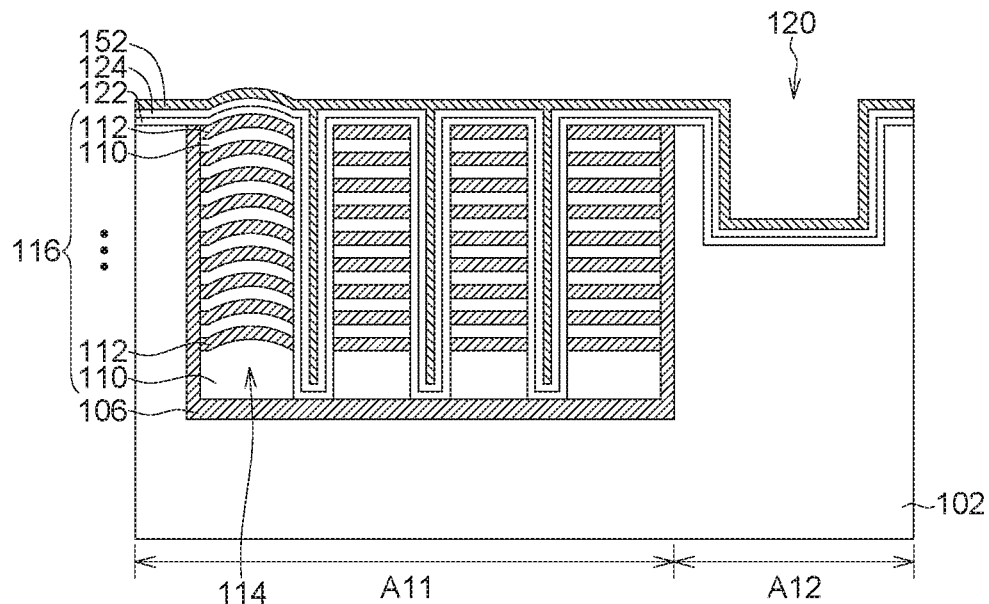

As shown in FIG. 1E, a first dielectric layer 152 is formed on the first stacks 116. The first dielectric layer 152 may be further filled into remaining spaces of the trenches 118. The first dielectric layer 152 may be further conformally formed in the opening 120. The first dielectric layer 152 may be formed of oxide.

Figure 1F:
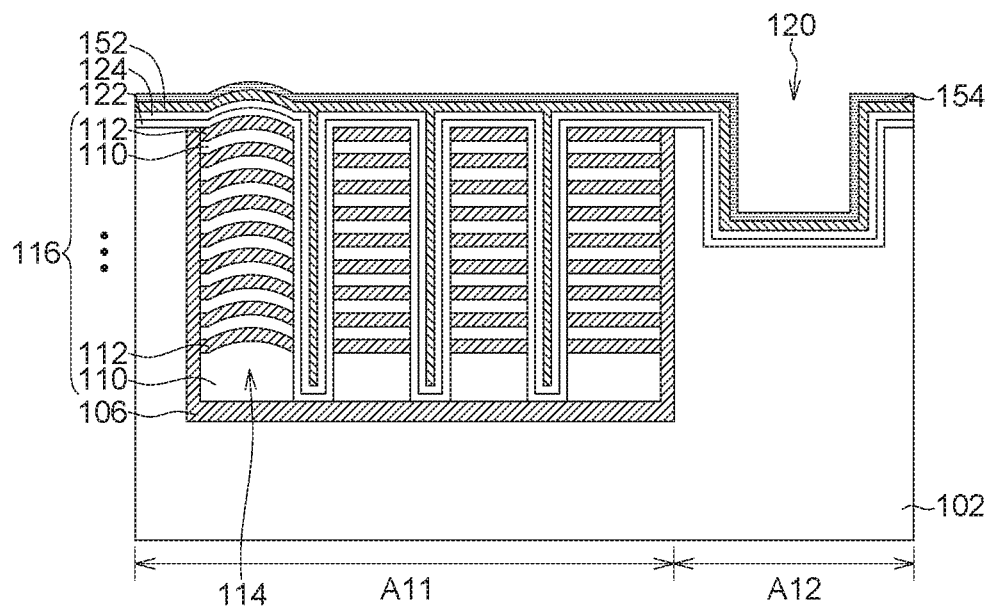

As shown in FIG. 1F, a first hard mask layer 154 is formed on the first dielectric layer 152. The first hard mask layer 154 is formed of a material different from a material forming the first dielectric layer 152 and a material forming the insulating layers 112. For example, the first hard mask layer 154 may be formed of silicon nitride. Here, the first hard mask layer 154 can be used as a sacrificial hard mask layer.

Figure 1G:
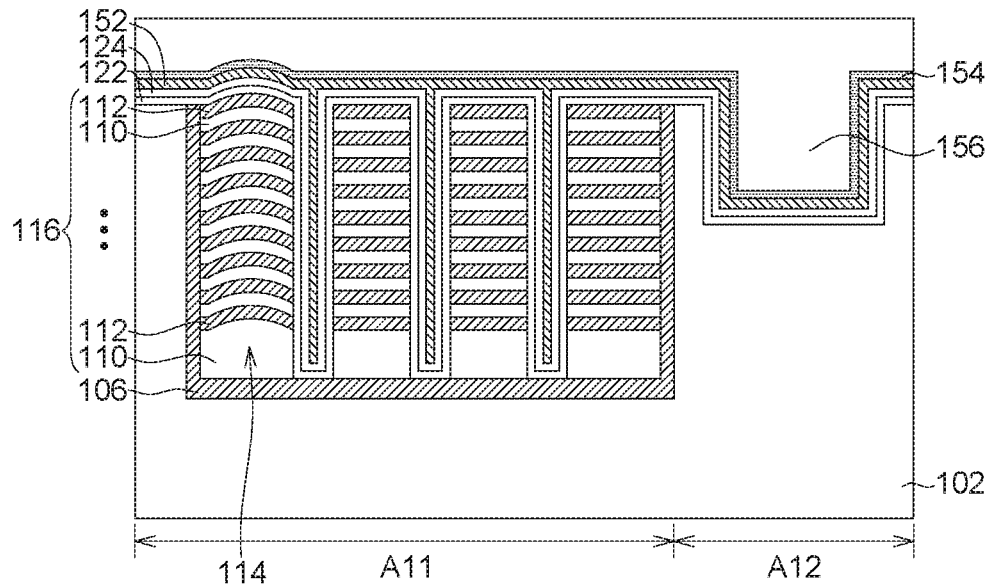

As shown in FIG. 1G, an insulating material 156 is formed on the first hard mask layer 154. The insulating material 156 may be further filled into a remaining space of the opening 120. The insulating material 156 may be oxide.

Figure 1H:
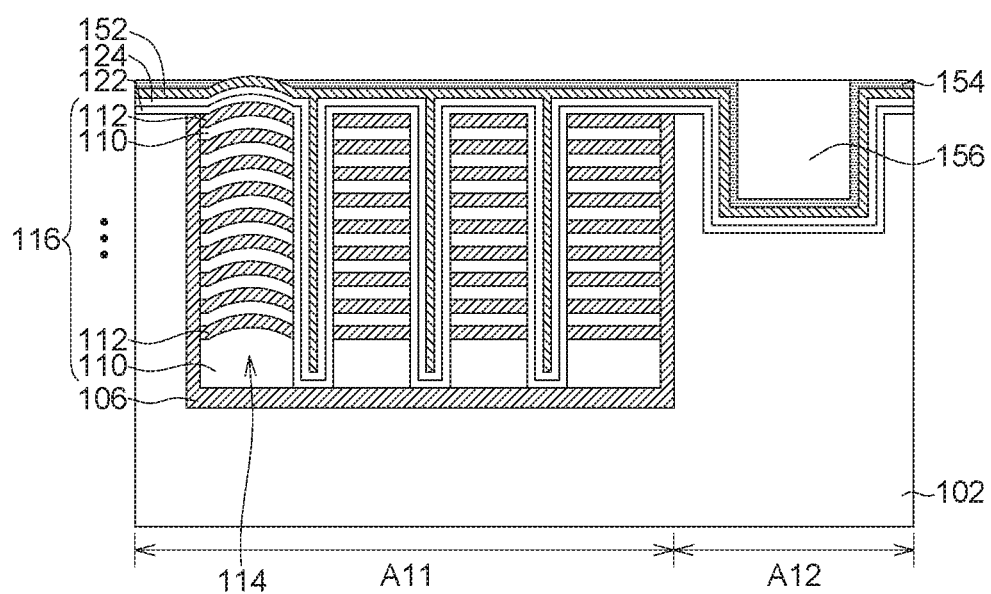

As shown in FIG. 1H, a planarization process, such as a chemical mechanical planarization (CMP) process, is conducted. The planarization process is stopped on the first hard mask layer 154. For example, the planarization process can be stopped on a flat top surface of the first hard mask layer 154 (i.e., the top surface of the first hard mask layer 154 except a local non-flat top surface produced by the irregular portion 114). At this time, the first hard mask layer 154 may be completely removed at a position above the local non-flat top surface produced by the irregular portion 114, and the first dielectric layer 152 may be exposed at this position. In other words, the first hard mask layer 154 is broken at a position corresponding to the irregular portion 114 of the first stacks 116.

Figure 1I:
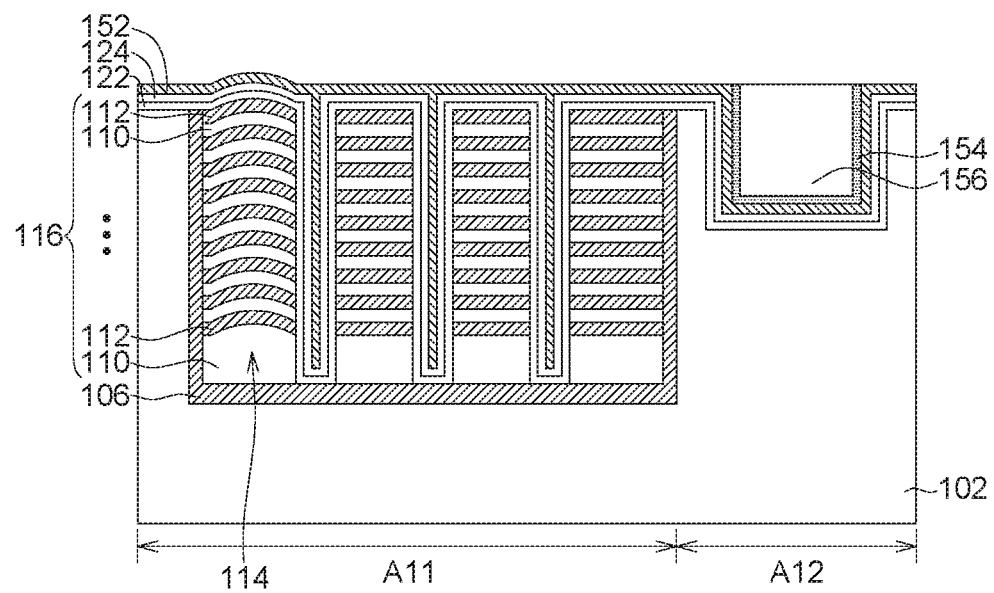

Then, as shown in FIG. 1I, the first hard mask layer 154, which may comprise a broken portion, is removed. A portion of the first hard mask layer 154 in the opening 120 may be remained after this step. In particular, the portion of the first hard mask layer 154 that is buried under the insulating material 156 may be remained.

Figure 1J:
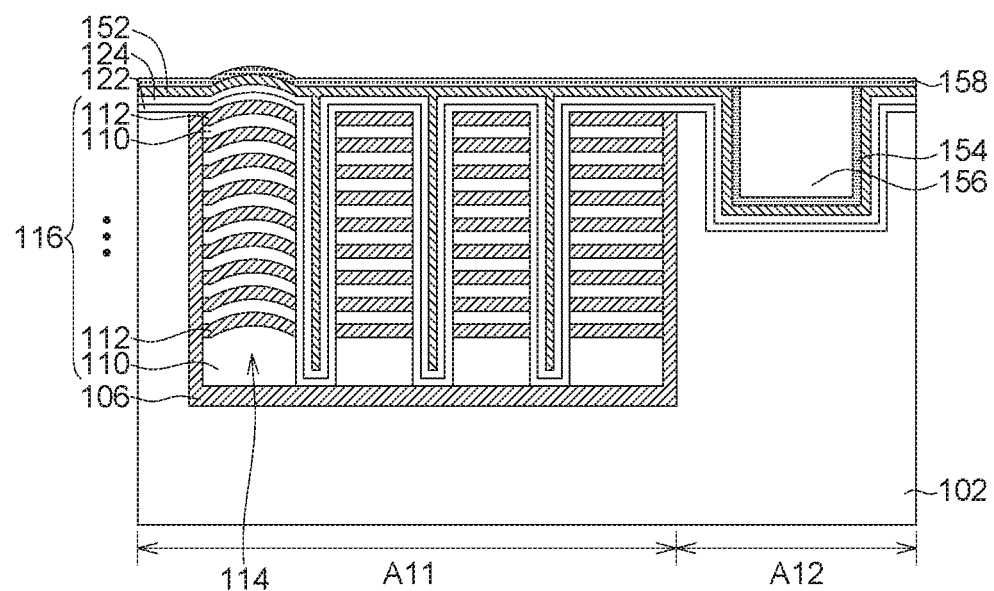

As shown in FIG. 1J, a second hard mask layer 158 is formed on the first dielectric layer 152. The newly formed second hard mask layer 158 is continuously disposed on the first dielectric layer 152, and particularly continuously disposed at a position corresponding to the irregular portion 114 of the first stacks 116 without a break. The second hard mask layer 158 may be formed of a material the same as a material forming the first hard mask layer 154. The second hard mask layer 158 is formed of a material different from a material forming the first dielectric layer 152 and a material forming the insulating layers 112. For example, the second hard mask layer 158 may be formed of silicon nitride. In the periphery region A12, the second hard mask layer 158 together with the first hard mask layer 154 may surround the insulating material 156 in the opening 120.

Figure 1K:
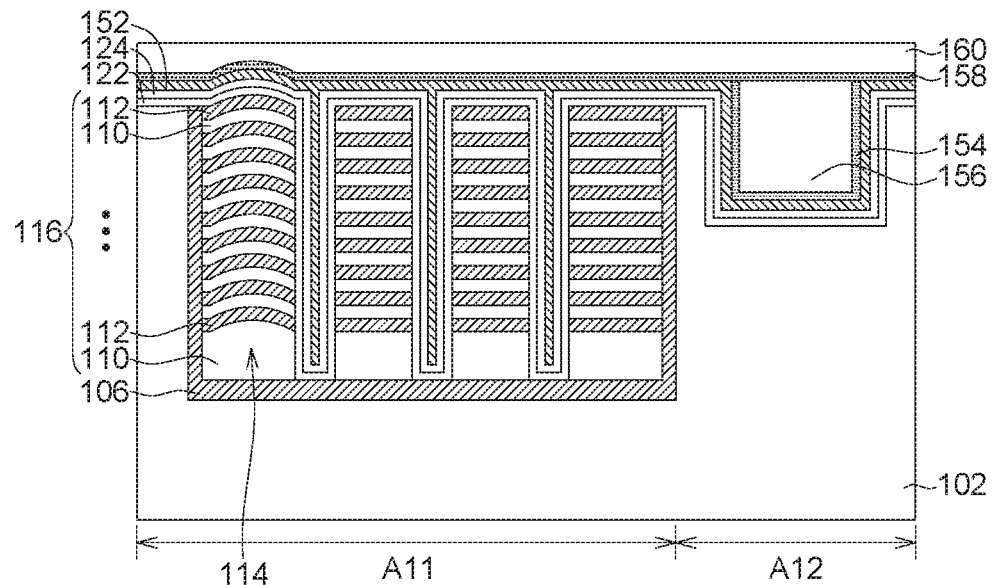
Figure 1L:
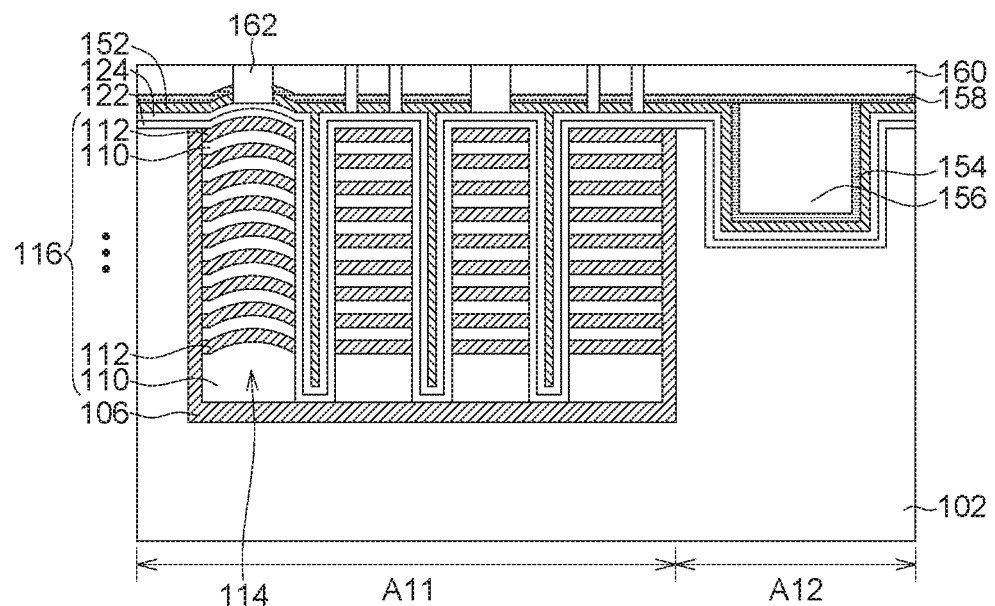

As shown in FIG. 1K, a second dielectric layer 160 is formed on the second hard mask layer 158. The second dielectric layer 160 may be formed of oxide. Then, as shown in FIG. 1L, a plurality of contacts 162 are formed through the second dielectric layer 160, the second hard mask layer 158 and the first dielectric layer 152 to the preliminary structure 150. According to some embodiments, the formation of the contacts 162 comprises forming holes penetrating through the second dielectric layer 160. The holes may be formed by an etching process stopped on the second hard mask layer 158 formed of, for example, silicon nitride. Then, the holes are further extended to expose the channel layer 124. A conductive material, such as polysilicon, is filled into the holes, and thereby the contacts 162 coupled with the channel layer 124 are formed.

Here, since the first hard mask layer 154 that may comprise a broken portion is replaced with the newly formed and intact second hard mask layer 158, the contacts 162 can be formed as desired. In contrast, if the first hard mask layer 154 is not used as a sacrificial hard mask layer, but directly used in the formation of the contacts 162, the holes for the contacts may be over-extended and expose the conductive layers 110 of the first stacks 116 due to the broken of the first hard mask layer 154 at the position corresponding to the irregular portion 114. This will lead to the short circuit between overlying conductive lines (such as bit lines) and the conductive layers 110 (such as word lines).

Referring to FIG. 1L, a semiconductor structure formed by the exemplary method described above may have an array region A11 and a periphery region A12. The semiconductor structure comprises a plurality of first stacks 116 in the array region A11 and an opening 120 in the periphery region A12. Each of the first stacks 116 comprises alternately stacked conductive layers 110 and insulating layers 112. In the example shown in FIG. 1L, the semiconductor structure comprises a substrate 102 having a recess portion 104 in the array region A11. In some embodiments, the semiconductor structure further comprises an isolation layer 106 conformally disposed in the recess portion 104. The first stacks 116 are disposed in the recess portion 104 and isolated from the substrate 102 by the isolation layer 106. The opening 120 is directly formed in the substrate 102 in the periphery region A12. According to some embodiments, the semiconductor structure is a memory structure, and further comprises a memory layer 122 and a channel layer 124. The memory layer 122 is conformally disposed on the first stacks 116 and trenches 118 separating the first stacks 116, and is conformally disposed in the opening 120. The channel layer 124 is conformally disposed on the memory layer 122. In some embodiments, the conductive layers 110 are provided as word lines, and memory cells can be defined at crosspoints between the word lines and the channel layer 124.

The semiconductor structure comprises a first dielectric layer 152 disposed on the first stacks 116 and conformally disposed in the opening 120. For example, the first dielectric layer 152 may be disposed on the channel layer 124. The semiconductor structure comprises a first hard mask layer 154 conformally disposed on the first dielectric layer 152 in the opening 120. The semiconductor structure comprises an insulating material 156 filled into a remaining space of the opening 120, wherein the insulating material 156 having a flat top surface. The semiconductor structure comprises a second hard mask layer 158 disposed on the first dielectric layer 152 on the first stacks 116 and disposed on the flat top surface of the insulating material 156 in the opening 120. In some embodiments, the second hard mask layer 158 together with the first hard mask layer 154 surrounds the insulating material 156 in the opening 120. According to some embodiments, the first hard mask layer 154 and the second hard mask layer 158 are formed of a material different from a material forming the first dielectric layer 152 and a material forming the insulating layers 112. For example, the first hard mask layer 154 and the second hard mask layer 158 are formed of silicon nitride. The semiconductor structure comprises a second dielectric layer 160 disposed on the second hard mask layer 158. The semiconductor structure further comprises a plurality of contacts 162 penetrating through the second dielectric layer 160, the second hard mask layer 158 and the first dielectric layer 152. The contacts 162 can land on the channel layer 124.

Referring to FIGS. 2A-2L, another exemplary forming method according to embodiments is shown. For ease of understanding, the method is illustrated to form a semiconductor structure that can be a 3-D single gate vertical channel (SGVC) memory structure.

Figure 2A:
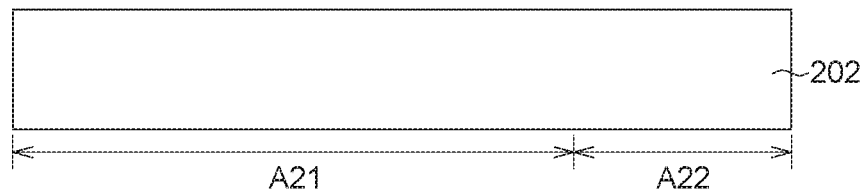
FIGS. 2A-2L illustrate another method for forming a semiconductor structure according to embodiments.

As shown in FIG. 2A, a substrate 202 is provided. The substrate 202 may be formed of polysilicon or the like. The substrate 202 has an array region A21. The substrate 202 may further have a periphery region A22.

Figure 2B:
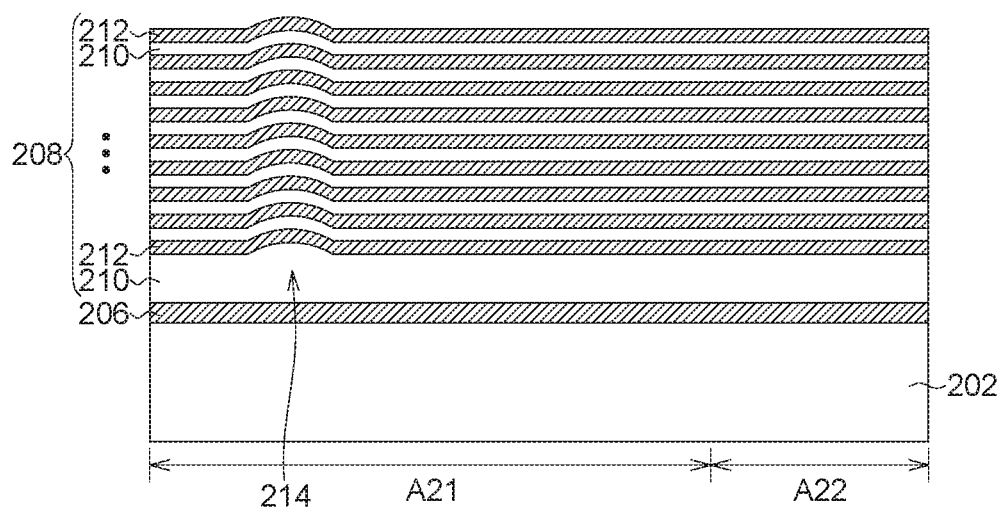
Figure 2C:
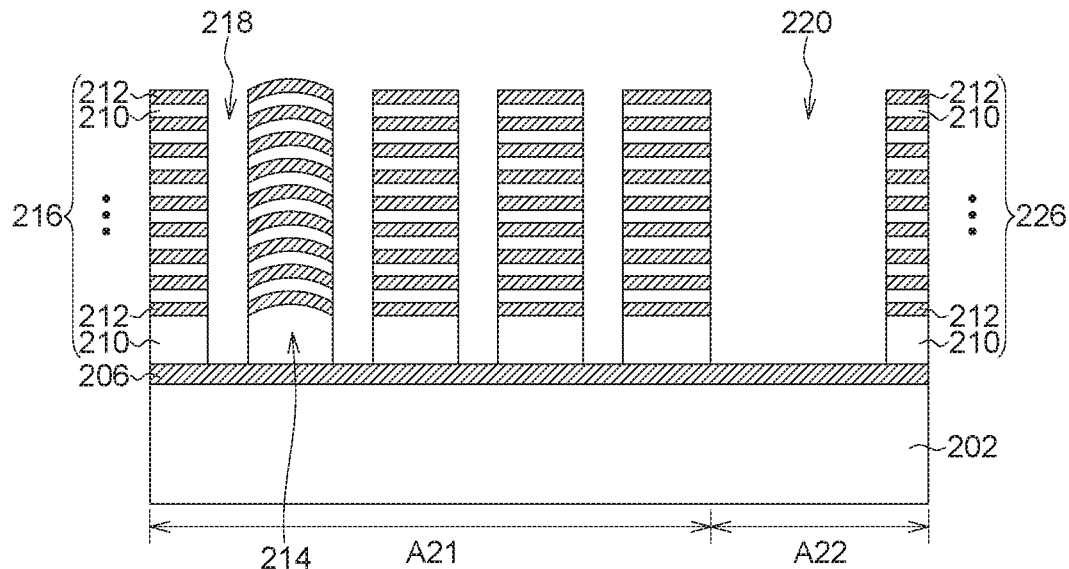

As shown in FIG. 2B, an initial stack 208 is formed on the substrate 202, such as in a manner that over the array region A21 and periphery region A22. More specifically, an isolation layer 206 may first be formed on the substrate 202. The isolation layer 206 may be formed of oxide. Then, the initial stack 208 is formed on the isolation layer 206 and isolated from the substrate 202 by the isolation layer 206. The initial stack 208 comprises alternately stacked conductive layers 210 and insulating layers 212. The conductive layers 210 may be formed of polysilicon, such as doped-polysilicon. The insulating layers 212 may be formed of oxide. In some cases, the initial stack 208 comprises an irregular portion 214, such as a bump portion. The irregular portion 214 may be caused by defects such as an impurity, a lattice dislocation or the like. For example, the irregular portion 214 may be formed in a conductive layer 210 formed of polysilicon during a deposition process due to the existence of an impurity, a lattice dislocation or the like. The irregular portion 214 produces a local non-flat top surface, such as the hill portion shown in the drawings.

As shown in FIG. 2O, a plurality of first stacks 216 are formed in the array region A21 by a patterning process. For example, a litho-etching process with a photo resist may be conducted. As such, the first stacks 216 are separated from each other by a plurality of trenches 218. In addition, by this patterning process, a second stack 226 is formed in the periphery region A22. An opening 220 is formed in the periphery region A22. The opening 220 is a trench adjacent to the second stack 226 for separation, such as a trench separating the second stack 226 and one of the first stacks 216.

Figure 2D:
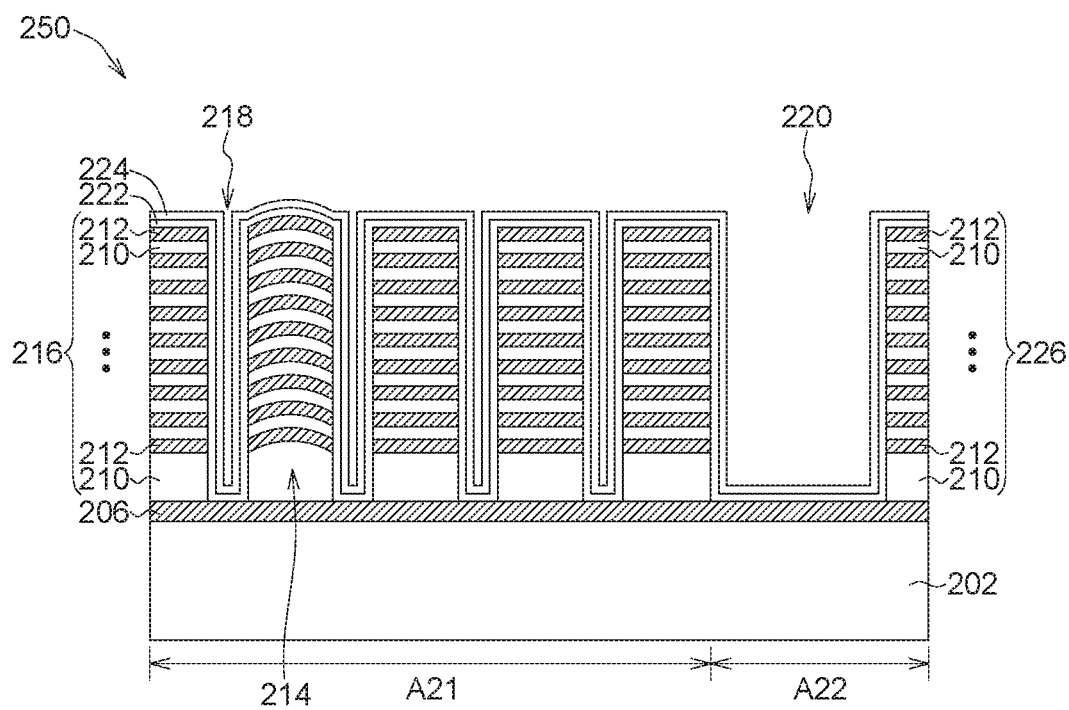

As shown in FIG. 2D, a memory layer 222 is conformally formed on the first stacks 216 and the trenches 218 separating the first stacks 216. The memory layer 222 may be further conformally formed in the opening 220. The memory layer 222 may comprise ONO multi-layers or the like. A channel layer 224 is conformally formed on the memory layer 222. The channel layer 224 may be formed of polysilicon.

As such, a preliminary structure 250 can be provided. The preliminary structure 250 has an array region A21. The preliminary structure 250 may further have a periphery region A22. The preliminary structure 250 may comprise a substrate 202. The preliminary structure 150 comprises a plurality of first stacks 216 in the array region A21. In the example shown in FIGS. 2A-2L, the first stacks 216 are formed on the substrate 202. Each of the first stacks 216 may comprise alternately stacked conductive layers 210 and insulating layers 212. The preliminary structure 250 may comprise a second stack 226 in the periphery region A22, wherein the first stacks 216 and the second stack 226 are continuously formed on the substrate 202. The preliminary structure 250 may further comprise an opening 220 in the periphery region A22. The opening 220 may be a trench adjacent to the second stack 226 for separation. The preliminary structure 250 may comprise an isolation layer 206 formed on the substrate 202, and the first stacks 116 and the second stack 226 are formed on the isolation layer 206. The preliminary structure 250 may further comprise a memory layer 222 and a channel layer 224. The memory layer 222 is conformally formed on the first stacks 216 and the trenches 218 separating the first stacks 216 and is conformally formed in the opening 220. The channel layer 224 is conformally formed on the memory layer 222.

Figure 2E:
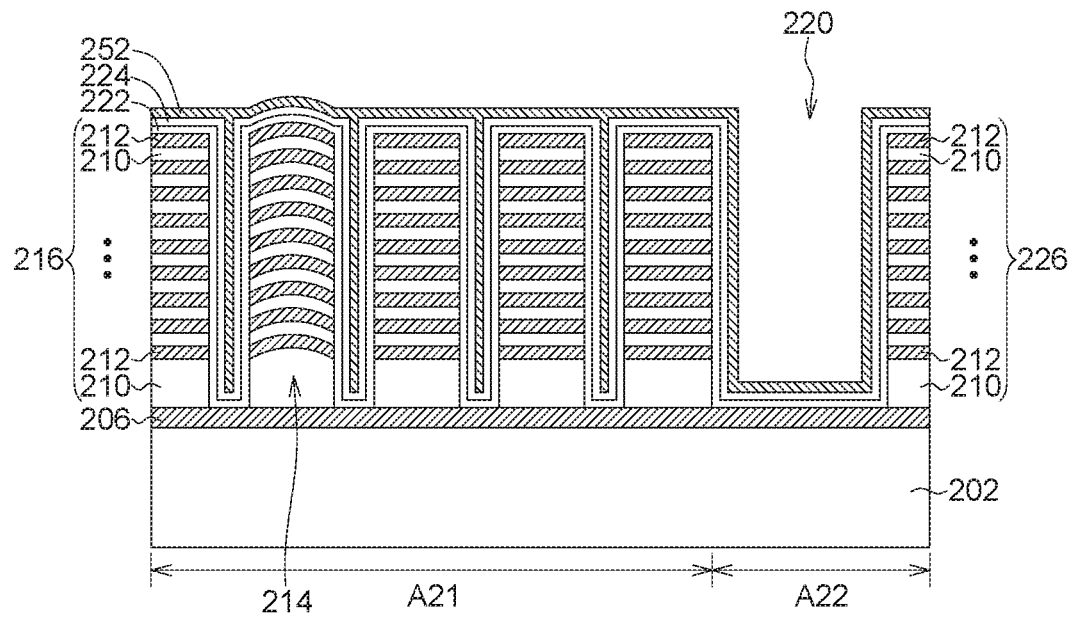

As shown in FIG. 2E, a first dielectric layer 252 is formed on the first stacks 216. The first dielectric layer 252 may be further filled into remaining spaces of the trenches 218. The first dielectric layer 252 may be further conformally formed in the opening 220. The first dielectric layer 252 may be formed of oxide.

Figure 2F:
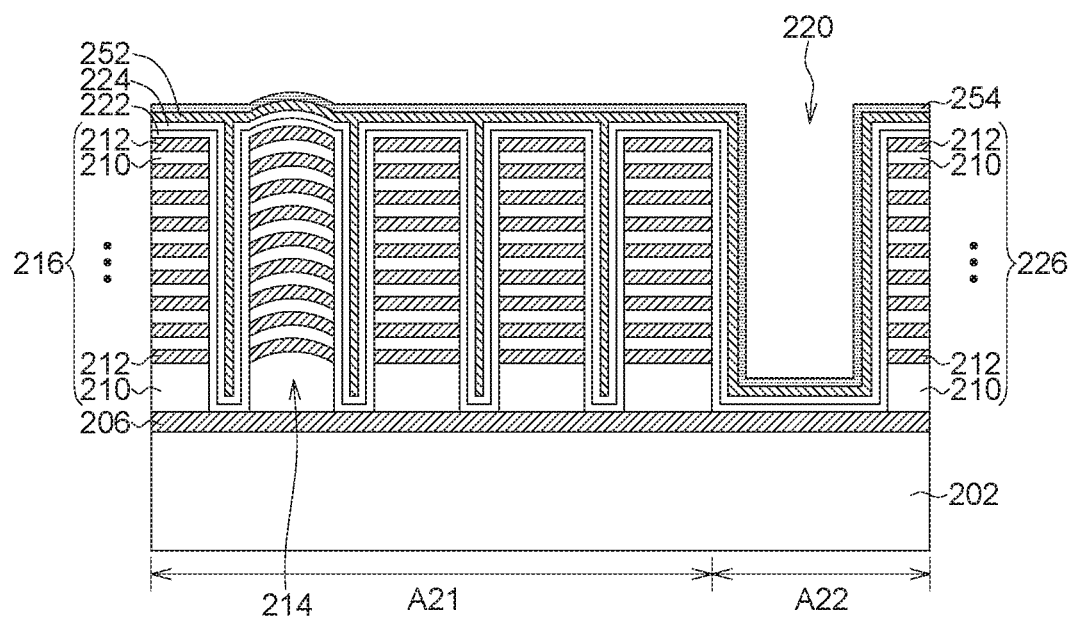

As shown in FIG. 2F, a first hard mask layer 254 is formed on the first dielectric layer 252. The first hard mask layer 254 is formed of a material different from a material forming the first dielectric layer 252 and a material forming the insulating layers 212. For example, the first hard mask layer 254 may be formed of silicon nitride. Here, the first hard mask layer 254 can be used as a sacrificial hard mask layer.

Figure 2G:
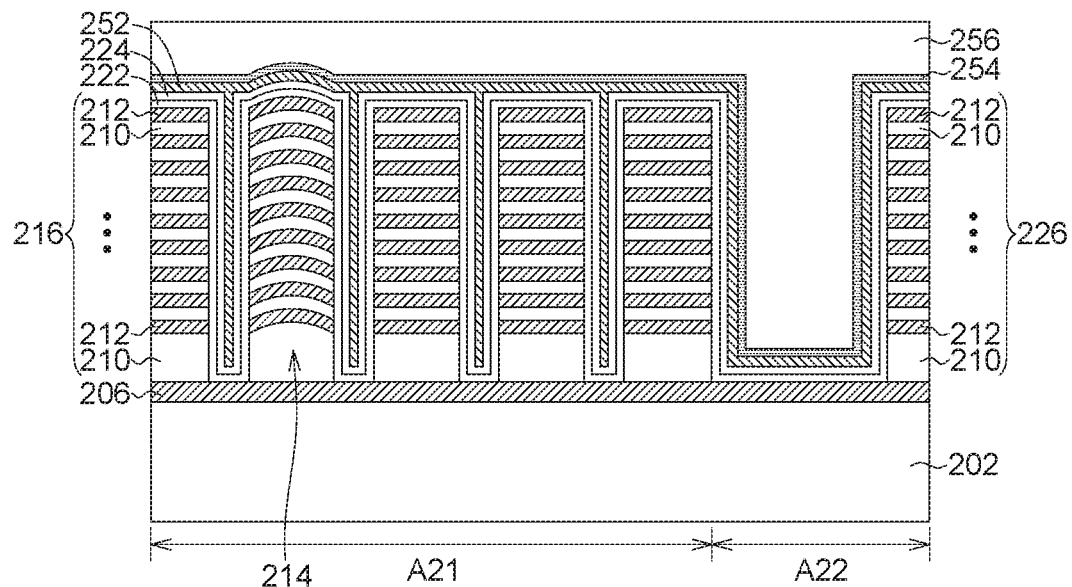

As shown in FIG. 2G, an insulating material 256 is formed on the first hard mask layer 254. The insulating material 256 may be further filled into a remaining space of the opening 220. The insulating material 256 may be oxide.

Figure 2H:
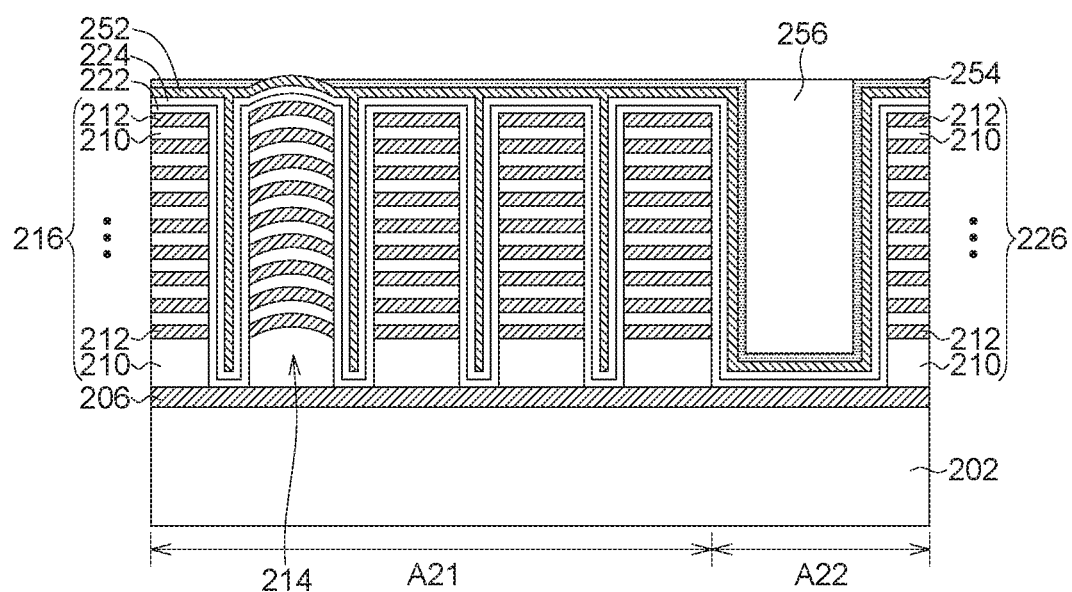

As shown in FIG. 2H, a planarization process, such as a CMP process, is conducted. The planarization process is stopped on the first hard mask layer 254. For example, the planarization process can be stopped on a flat top surface of the first hard mask layer 254 (i.e., the top surface of the first hard mask layer 254 except a local non-flat top surface produced by the irregular portion 214). At this time, the first hard mask layer 254 may be completely removed at a position above the local non-flat top surface produced by the irregular portion 214, and the first dielectric layer 252 may be exposed at this position. In other words, the first hard mask layer 254 is broken at a position corresponding to the irregular portion 214 of the first stacks 216.

Figure 2I:
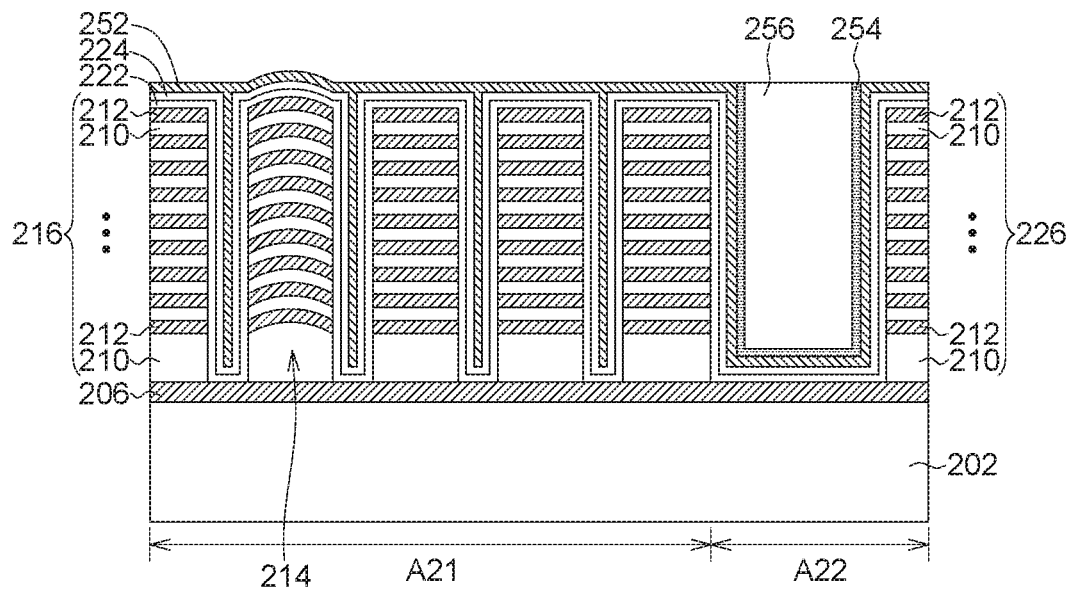

Then, as shown in FIG. 2I, the first hard mask layer 254, which may comprise a broken portion, is removed. A portion of the first hard mask layer 254 in the opening 220 may be remained after this step. In particular, the portion of the first hard mask layer 254 that is buried under the insulating material 256 may be remained.

Figure 2J:
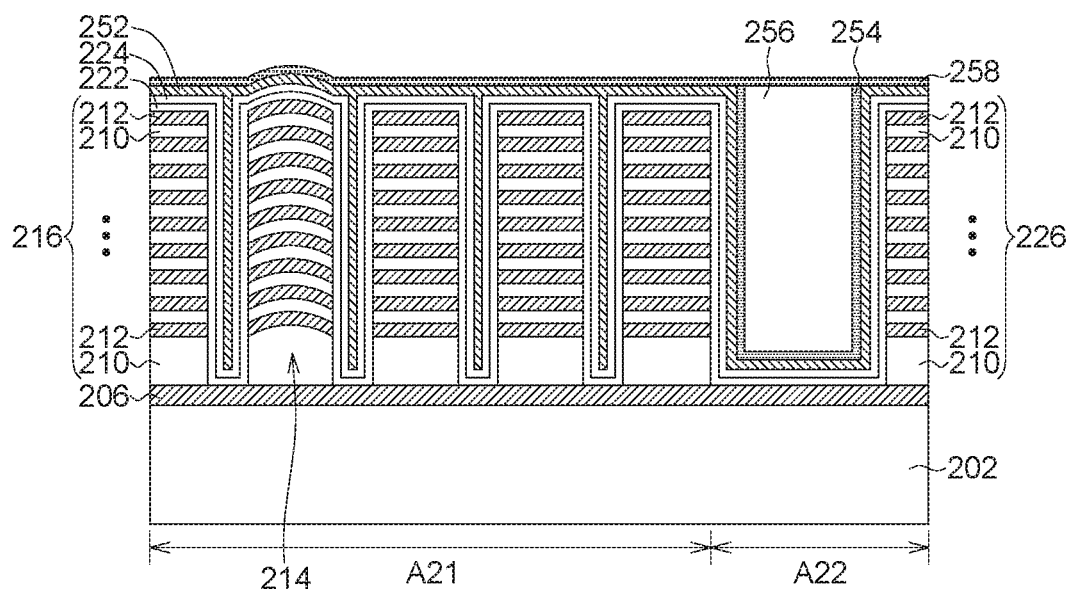

As shown in FIG. 2J, a second hard mask layer 258 is formed on the first dielectric layer 252. The newly formed second hard mask layer 258 is continuously disposed on the first dielectric layer 252, and particularly continuously disposed at a position corresponding to the irregular portion 214 of the first stacks 216 without a break. The second hard mask layer 258 may be formed of a material the same as a material forming the first hard mask layer 254. The second hard mask layer 258 is formed of a material different from a material forming the first dielectric layer 252 and a material forming the insulating layers 212. For example, the second hard mask layer 258 may be formed of silicon nitride. In the periphery region A22, the second hard mask layer 258 together with the first hard mask layer 254 may surround the insulating material 256 in the opening 220.

Figure 2K:
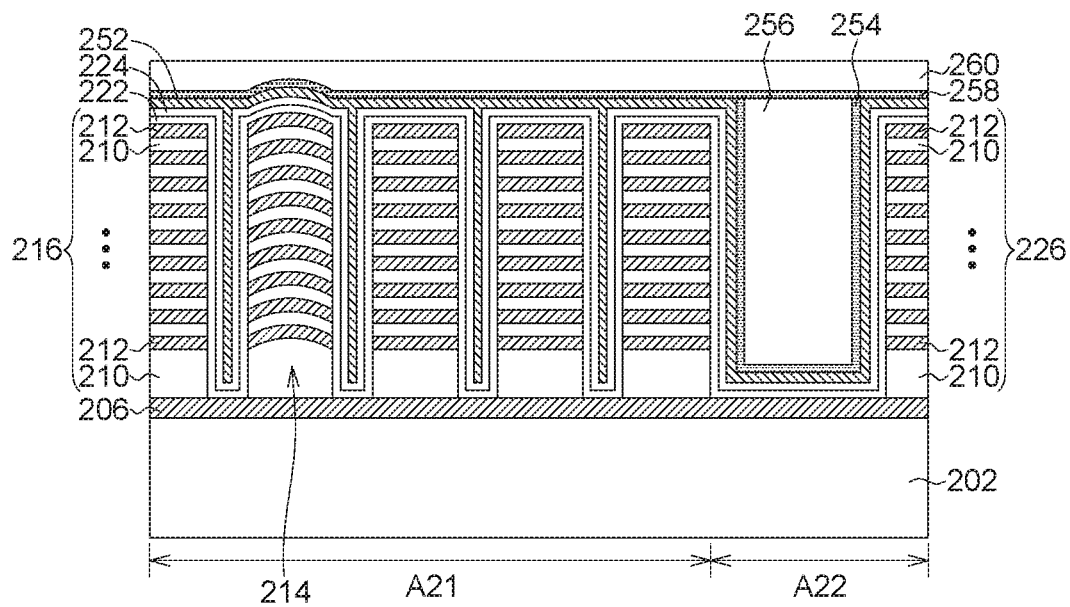
Figure 2L:
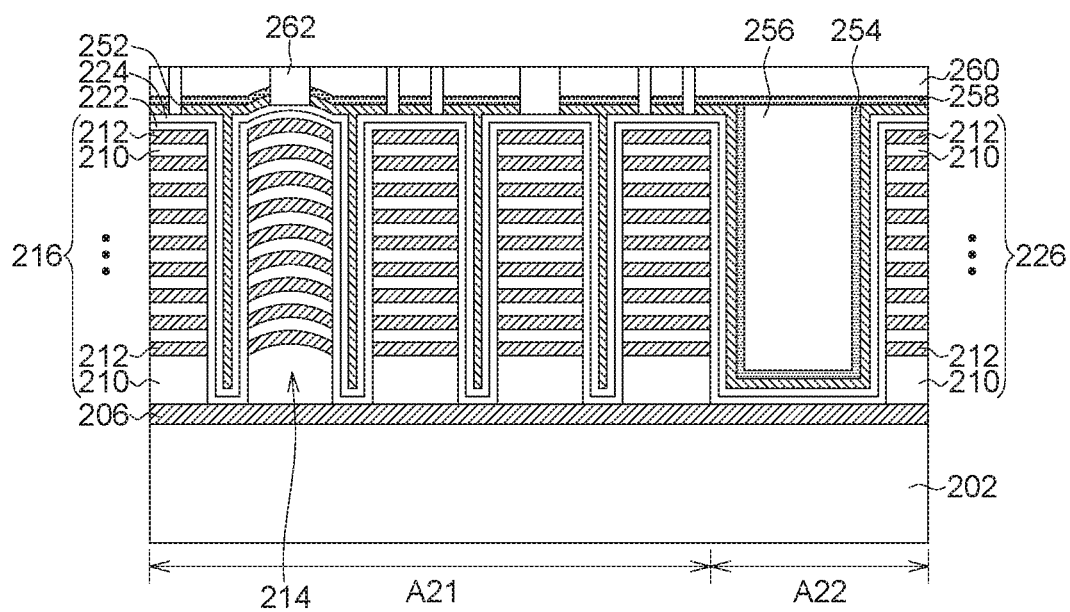

As shown in FIG. 2K, a second dielectric layer 260 is formed on the second hard mask layer 258. The second dielectric layer 260 may be formed of oxide. Then, as shown in FIG. 2L, a plurality of contacts 262 are formed through the second dielectric layer 260, the second hard mask layer 258 and the first dielectric layer 252 to the preliminary structure 250. According to some embodiments, the formation of the contacts 262 comprises forming holes penetrating through the second dielectric layer 260. The holes may be formed by an etching process stopped on the second hard mask layer 258 formed of, for example, silicon nitride. Then, the holes are further extended to expose the channel layer 224. A conductive material, such as polysilicon, is filled into the holes, and thereby the contacts 262 coupled with the channel layer 224 are formed.

Here, since the first hard mask layer 254 that may comprise a broken portion is replaced with the newly formed and intact second hard mask layer 258, the contacts 262 can be formed as desired. In contrast, if the first hard mask layer 254 is not used as a sacrificial hard mask layer, but directly used in the formation of the contacts 262, a short circuit may happen between overlying conductive lines (such as bit lines) and the conductive layers 210 (such as word lines), as described above.

Referring to FIG. 2L, a semiconductor structure formed by another exemplary method described above may has an array region A11 and a periphery region A12. The semiconductor structure comprises a plurality of first stacks 216 in the array region A21 and an opening 220 in the periphery region A22. Each of the first stacks 216 comprises alternately stacked conductive layers 210 and insulating layers 212. In the example shown in FIG. 2L, the semiconductor structure comprises a substrate 202, and the first stacks 216 are disposed on the substrate 202. The semiconductor structure may further comprise a second stack 226 in the periphery region A22, wherein the first stacks 216 and the second stack 226 are continuously disposed on the substrate 202. The opening 220 in this example is a trench adjacent to the second stack 226 for separation. In some embodiments, the semiconductor structure further comprises an isolation layer 206 disposed on the substrate 202, and the first stacks 216 and the second stack 226 are disposed on the isolation layer 206. According to some embodiments, the semiconductor structure is a memory structure, and further comprises a memory layer 222 and a channel layer 224. The memory layer 222 is conformally disposed on the first stacks 216 and trenches 218 separating the first stacks 216, and is conformally disposed in the opening 220. The channel layer 224 is conformally disposed on the memory layer 222. In some embodiments, the conductive layers 210 are provided as word lines, and memory cells can be defined at cross-points between the word lines and the channel layer 224.

The semiconductor structure comprises a first dielectric layer 252 disposed on the first stacks 216 and conformally disposed in the opening 220. For example, the first dielectric layer 252 may be disposed on the channel layer 224. The semiconductor structure comprises a first hard mask layer 254 conformally disposed on the first dielectric layer 252 in the opening 220. The semiconductor structure comprises an insulating material 256 filled into a remaining space of the opening 220, wherein the insulating material 256 having a flat top surface. The semiconductor structure comprises a second hard mask layer 258 disposed on the first dielectric layer 252 on the first stacks 216 and disposed on the flat top surface of the insulating material 256 in the opening 220. In some embodiments, the second hard mask layer 258 together with the first hard mask layer 254 surrounds the insulating material 256 in the opening 220. According to some embodiments, the first hard mask layer 254 and the second hard mask layer 258 are formed of a material different from a material forming the first dielectric layer 252 and a material forming the insulating layers 212. For example, the first hard mask layer 254 and the second hard mask layer 258 are formed of silicon nitride. The semiconductor structure comprises a second dielectric layer 260 disposed on the second hard mask layer 258. The semiconductor structure further comprises a plurality of contacts 262 penetrating through the second dielectric layer 260, the second hard mask layer 258 and the first dielectric layer 252. The contacts 262 can land on the channel layer 224.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for forming a semiconductor structure, comprising: providing a preliminary structure having an array region, wherein the preliminary structure comprises a plurality of first stacks in the array region;
    forming a first dielectric layer on the first stacks;
    forming a first hard mask layer on the first dielectric layer;
    forming an insulating material on the first hard mask layer;
    conducting a planarization process stopped on the first hard mask layer; removing the first hard mask layer;

forming a second hard mask layer on the first dielectric layer;

forming a second dielectric layer on the second hard mask layer; and forming a plurality of contacts through the second dielectric layer, the second hard mask layer and the first dielectric layer to the preliminary structure;

wherein the preliminary structure further has a periphery region and comprises an opening in the periphery region, wherein the first dielectric layer further conformally formed in the opening, and wherein the insulating material is further filled into a remaining space of the opening.

2. The method according to claim 1, wherein the second hard mask layer together with the first hard mask layer surrounding the insulating material in the opening.

3. The method according to claim 1, wherein each of the first stacks comprises alternately stacked conductive layers and insulating layers, and the preliminary structure further comprises:

a memory layer conformally formed on the first stacks and trenches separating the first stacks and conformally formed in the opening;

a channel layer conformally formed on the memory layer;

wherein the first dielectric layer is formed on the channel layer and filled into remaining spaces of the trenches, and the contacts land on the channel layer.

4. The method according to claim 3, wherein the preliminary structure further comprises:

a substrate having a recess portion in the array region; and an isolation layer conformally disposed in the recess portion;

wherein the first stacks are formed in the recess portion and isolated from the substrate by the isolation layer, and wherein the opening is directly formed in the substrate in the periphery region.

5. The method according to claim 3, wherein the preliminary structure further comprises:

a substrate;

wherein the first stacks are formed on the substrate.

6. The method according to claim 5, wherein the preliminary structure further comprises:

a second stack in the periphery region, the first stacks and the second stack are continuously formed on the substrate;

wherein the opening is a trench adjacent to the second stack for separation.

7. The method according to claim 6, wherein the preliminary structure further comprises:

an isolation layer formed on the substrate, wherein the first stacks and the second stack are formed on the isolation layer.

8. The method according to claim 3, wherein the first hard mask layer and the second hard mask layer are formed of a material different from a material forming the first dielectric layer and a material forming the insulating layers.

9. The method according to claim 8, wherein the first hard mask layer and the second hard mask layer are formed of silicon nitride.

10. A semiconductor structure having an array region and a periphery region, the semiconductor structure comprising:

a plurality of first stacks in the array region;

an opening in the periphery region;

a first dielectric layer disposed on the first stacks and conformally disposed in the opening;

a first hard mask layer conformally disposed on the first dielectric layer in the opening;

an insulating material filled into a remaining space of the opening, the insulating material having a flat top surface;

a second hard mask layer disposed on the first dielectric layer on the first stacks and disposed on the flat top surface of the insulating material in the opening;

a second dielectric layer disposed on the second hard mask layer; and a plurality of contacts penetrating through the second dielectric layer, the second hard mask layer and the first dielectric layer.

11. The semiconductor structure according to claim 10, wherein the second hard mask layer together with the first hard mask layer surrounding the insulating material in the opening.

12. The semiconductor structure according to claim 10, wherein each of the first stacks comprises alternately stacked conductive layers and insulating layers, and the semiconductor structure further comprises:

a memory layer conformally disposed on the first stacks and trenches separating the first stacks and conformally disposed in the opening;

a channel layer conformally disposed on the memory layer;

wherein the first dielectric layer is disposed on the channel layer and filled into remaining spaces of the trenches, and the contacts land on the channel layer.

13. The semiconductor structure according to claim 12, further comprising:

a substrate having a recess portion in the array region; and an isolation layer conformally disposed in the recess portion;

wherein the first stacks are disposed in the recess portion and isolated from the substrate by the isolation layer, and wherein the opening is directly formed in the substrate in the periphery region.

14. The semiconductor structure according to claim 12, further comprising:

a substrate;

wherein the first stacks are disposed on the substrate.

15. The semiconductor structure according to claim 14, further comprising:

a second stack in the periphery region, the first stacks and the second stack are continuously disposed on the substrate;

wherein the opening is a trench adjacent to the second stack for separation.

16. The semiconductor structure according to claim 15, further comprising:

an isolation layer disposed on the substrate, wherein the first stacks and the second stack are disposed on the isolation layer.

17. The semiconductor structure according to claim 12, wherein the first hard mask layer and the second hard mask layer are formed of a material different from a material forming the first dielectric layer and a material forming the insulating layers.

18. The semiconductor structure according to claim 17, wherein the first hard mask layer and the second hard mask layer are formed of silicon nitride.

* * * * *